United States Patent [19]

Baliga et al.

[11] 4,343,015

[45] Aug. 3, 1982

[54] VERTICAL CHANNEL FIELD EFFECT TRANSISTOR

[75] Inventors: Bantval J. Baliga; James R. Shealy, both of Clifton Park, N.Y.

[73] Assignee: General Electric Company, Schenectady, N.Y.

[21] Appl. No.: 149,936

[22] Filed: May 14, 1980

[51] Int. Cl.³ .............................................. G01L 29/06
[52] U.S. Cl. ........................................ 357/55; 357/22
[58] Field of Search .................................. 357/22, 55

[56] References Cited

U.S. PATENT DOCUMENTS 4,129,879 12/1978 Tantraporn et al. ................. 357/22
4,171,234 10/1979 Nagata et al. ........................ 357/55
4,262,296  4/1981 Shealy et al. ........................ 357/55

OTHER PUBLICATIONS

Donnelly et al., "Multiple-Energy Proton Bombardment in n+-GaAs", Solid State Electronics, 1977, vol. 20, pp. 183-189.
Stein, H. J.; "Electrical Studies of Low Temperature Neutron-and Electron-Irradiated Epitaxial n-Type GaAs", J. of Applied Physics, vol. 40, No. 13, Dec. 1969.
Foyt et al., "Isolation of Junction Devices in GaAs Using Proton Bombardment", Solid State Electronics, 1969, vol. 12, pp. 209-214.

Primary Examiner—R. A. Rosenberger
Attorney, Agent, or Firm—Charles E. Bruzga; James C. Davis, Jr.; Marvin Snyder

[57] ABSTRACT

Improved high frequency GaAs FETs have a higher breakdown voltage, lower input gate capacitance and lower source (or drain) resistance. A preferentially etched groove structure yields parallel trapezoidal semiconductor fingers that are wider at the top than at the bottom. Every finger intersects a high resistivity, semi-insulating region which surrounds the active device area and is fabricated by high energy particle bombardment. Metal gates are deposited within the grooves on three sides of the trapezoidal fingers.

12 Claims, 11 Drawing Figures

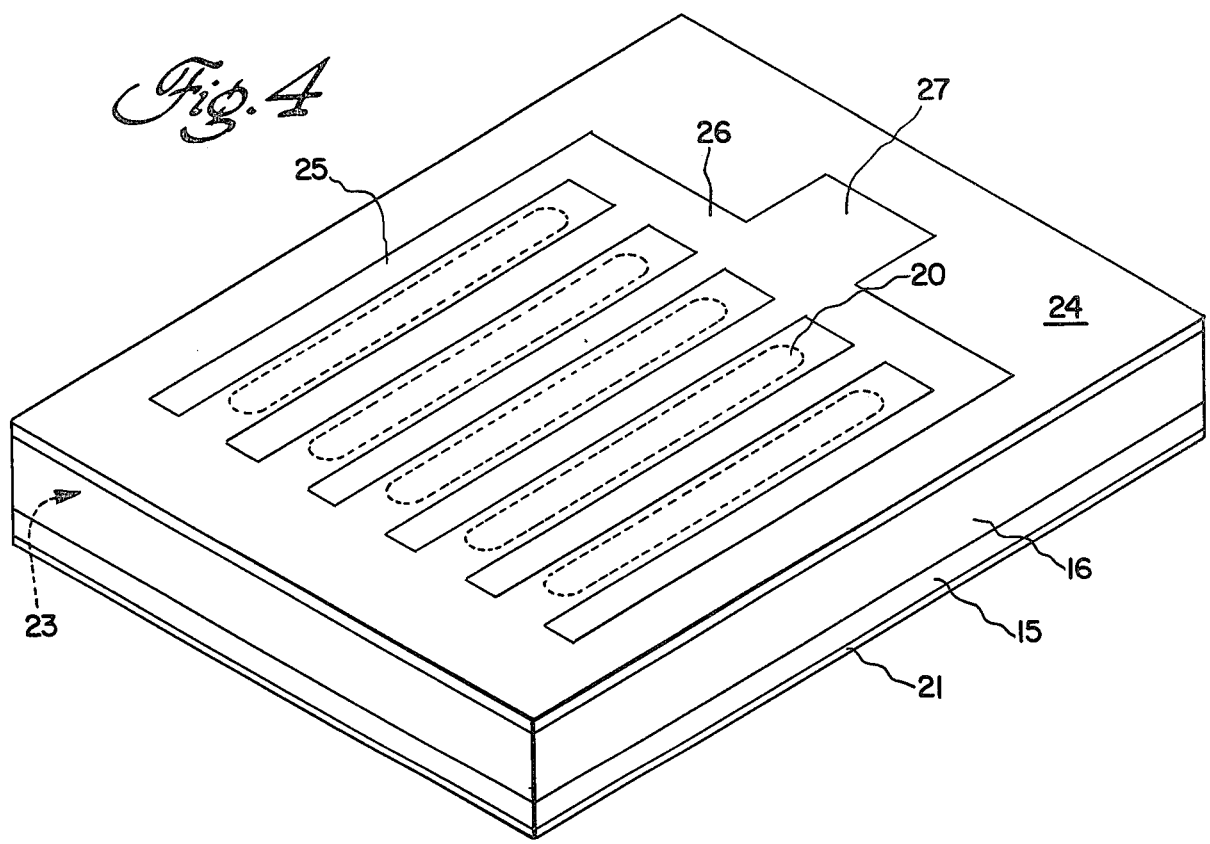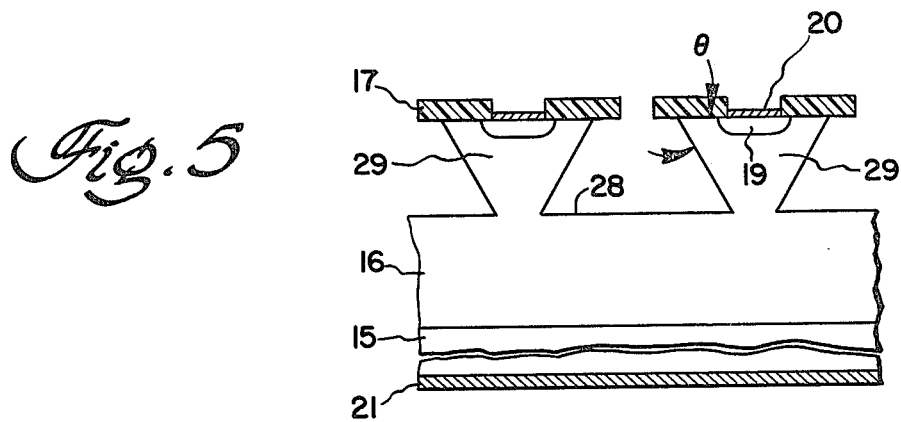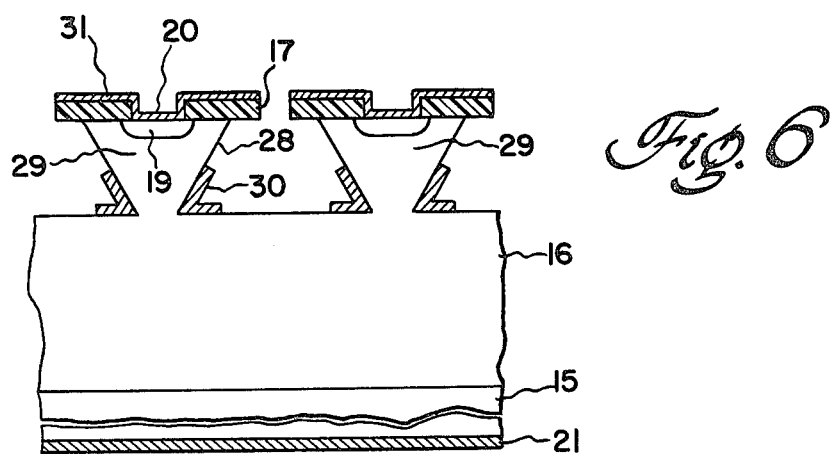

VERTICAL CHANNEL FIELD EFFECT TRANSISTOR

BACKGROUND OF THE INVENTION

This invention relates to high frequency semiconductor devices and methods for their fabrication, and especially to improved vertical channel field effect transistor structures isolated by using high energy electron, neutron or proton bombardment.

Vertical channel FETs have been made out of silicon to operate at high voltages and high current levels. However, the power handling capability of a gallium arsenide device with the same area is expected to be higher. The vertical FET in U.S. Pat. No. 4,129,879 to W. Tantraporn and S. P. Yu has the channel regions in elongated fingers upstanding from the substrate which is the common source or drain; gate metal surrounds the finger and forms an electronically blocking contact to the channel which extends completely across the finger from wall to wall without interruption. Copending application Ser. No. 061,450 filed on July 27, 1979 by J. R. Shealy, B. J. Baliga, W. Tantraporn and P.V. Gray, now issued as U.S. Pat. No. 4,262,296, covers an improved vertical FET of gallium arsenide or other III-V semiconductor which has a preferentially etched groove structure in the top surface which yields parallel trapezoidal semiconductor fingers that are wider at the top than at the bottom. Gate regions are fabricated in the grooves surrounding the fingers. The vertical conducting channels are narrow leading to a high blocking gain and more contact area is available at the top of the device.

The performance of the latter high frequency device is limited by the following. The active area of the device must be properly terminated in order to get high gate-drain breakdown voltages. Second, the gate contact pad adds a significant parasitic capacitance. Third, the device contains individual source (or drain) fingers which are isolated from each other by the etching of the trapezoidal grooves. These are mechanically fragile and need to be connected together during device packaging, and this is expected to lower the yield and increase the contact resistance.

SUMMARY OF THE INVENTION

Selective areas of the gallium arsenide vertical channel FET are converted into high resistivity, semi-insulating regions by irradiation with high energy particles. The active device area is protected and the rest of the chip, or at least those areas which will underlie the contact pads, is irradiated with electrons, protons or neutrons to convert it into high resistivity GaAs. The trapezoidal semiconductor fingers have a preferentially etched groove structure surrounding them on three sides, and the other end of every finger intersects the high resistivity region. Contact metallizations on the tops of these semiconductor fingers are all interconnected with a source (or drain) contact pad to which an external electrical connection can be made. Consequently, this solves the problem of connecting the semiconductor fingers together and provides a low source (or drain) resistance. Schottky metal gates are deposited within the grooved grid structure at least on the lower part of the walls of the trapezoidal fingers and are interconnected with a gate contact pad which is on the high resistivity region. This reduces the parasitic gate pad capacitance.

An additional improvement in device characteristics can be achieved by irradiating the inactive area at the middle of the gate grooves. The radiation is performed after defining the contact metallization for the tops of the semiconductor fingers but before etching the grooves and fabricating the gate regions. Gate metal can now cover the entire bottom wall of the grooves; this decreases the gate input resistance and in turn improves the frequency response.

One embodiment is a high voltage, extended drain Schottky gate vertical channel FET useful as a power source for high power rf applications. The source is at the top and the drain at the bottom; the minimum channel width is about 5-10 $\mu$m. Another embodiment for ultra high frequency applications above 1 GHz has the drain on top and a narrow channel width of 1 $\mu$m or less.

BRIEF DESCRIPTION OF THE DRAWINGS

FIGS. 1-6 are schematic perspective and cross-sectional views of steps in the fabrication of an improved vertical channel FET having an irradiated high resistivity region surrounding the active area;

DESCRIPTION OF THE PREFERRED EMBODIMENTS

The main processing steps for making an improved n-channel, depletion mode, gallium arsenide Schottky gate field effect transistor are depicted in FIGS. 1-7. It has been shown that high energy electron, neutron or proton bombardment can convert n-type GaAs into high resistivity, semi-insulating GaAs. Refer to "Electrical Studies of Low-Temperature Neutron-and Electron-Irridiated Epitaxial n-type GaAs," H. J. Stein, Journal of Applied Physics, Vol. 40, No. 13, pages 5300-5307, December 1969; "Multiple-Energy Proton Bombardment in n+-GaAs," J. P. Donnelly and F. J. Leonberger, Solid State Electronics, Vol. 20, pages 183-189, 1977; and others. This is made use of in several ways to obtain an improved vertical channel FET device structure. Many of the following steps are given in more detail in the previously mentioned copending application Ser. No. 061,450, now issued as U.S. Pat. No. 4,262,296.

Figure 1:
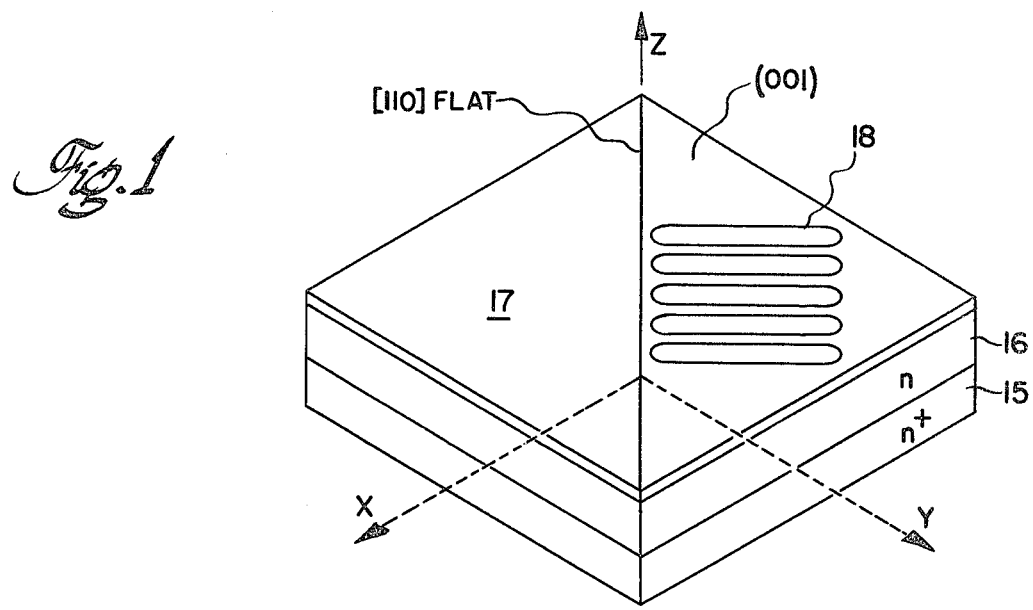
Figure 2:
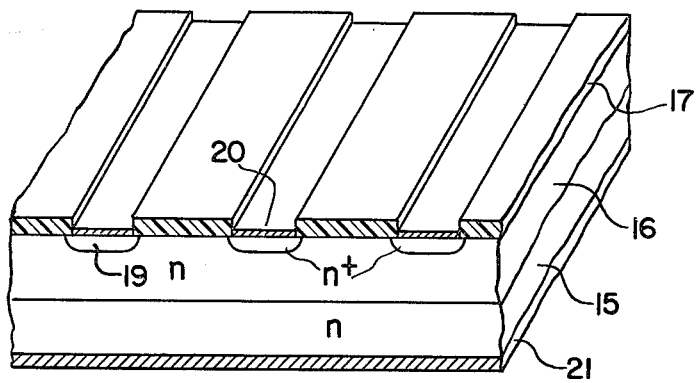

Assuming that the crystallographic directions are defined as in FIG. 1, a thin substrate layer 15 of (001) plane n+ gallium arsenide material cut from a single crystal has an n-type epitaxial layer 16 with a [110] flat (a natural cleavage plane) indicated on the crystal. A typical carrier concentration for the heavily doped substrate is approximately $10^{18} cm^{-3}$ and for the n-type epitaxial layer is in the range of $10^{14}-10^{17} cm^{-3}$ as required by the application. A phosphosilicate glass, silicon nitride or other insulating layer 17 has a pattern of elongated openings 18 made by conventional photoresist and etching techniques. The row of windows 18 are oriented normal to the [110] crystal flat and overlie the intended source regions. Referring to FIG. 2, the n+ source regions 19 are diffused into the top surface of epitaxial layer 16 followed by deposition of a metal such as germanium gold and patterning of the metal to yield source contacts 20. At this time the drain metallization 21 can be deposited on the opposing surface of substrate 15. A conventional treatment is carried out to yield ohmic contacts.

Figure 3:
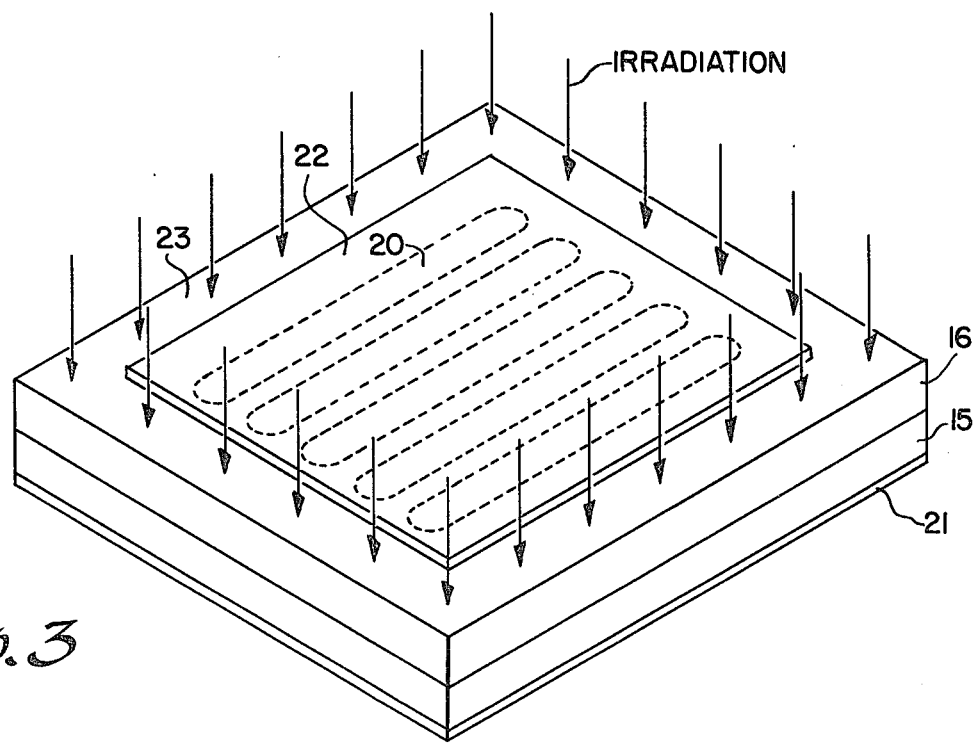

The next step, FIG. 3, is to apply a mask 22 to the top surface to protect the active device area during irradiation with high energy particles to convert the unmasked area of epitaxial layer 16 to a high resistivity, semi-insulating region 23. Electron irradiation is preferred but it is also possible to use neutron irradiation or proton bombardment. The irradiated inactive device area has a resistivity on the order of $10^4$–$10^8$ ohm-cm. Conversion of the whole depth of the layer is best, but partial conversion from the top surface down is possible if this results in adequate isolation. Mask 22 is a material that blocks or absorbs radiation such as a film of tungsten or photoresist. The process itself and appropriate masking materials are fully described in the literature. The mask is removed before proceeding with further processing.

In FIG. 4, the gate grid or gate region and gate contact pad are defined by depositing and patterning a photoresist mask 24 and the unmasked insulating layer is removed. The row of parallel windows 25, like source metallizations 20, are oriented normal to the [110] crystal flat. The pattern of photoresist mask openings further includes, at one end, a transversely extending window 26 and a gate pad opening 27. A preferential etch through rectangular windows 25 yields trapezoidal grooves 28, FIG. 5, due to anisotropic etch rates depending on the crystalline plane, i.e., the etched volume is bound by the slowest etched planes: (111)B on the side and (001) on the bottom. These grooves have an isosceles trapezoid cross section with the narrow base of the trapezoid at the top and the wide base at the bottom. At the same time the etch through transverse opening 26 results in a transversely extending groove 40 (see FIG. 7) which is also a trapezoid but with the narrow base at the bottom and which is as deep as grooves 28 and undercut beneath insulating layer 17. The etching of the gate contact pad well is a combination of these effects. After the etching process there remains a plurality of upstanding parallel, elongated semiconductor fingers 29 which individually have an isoceles trapezoid cross section with a wide base at the surface and a narrow base interior of the device. The grooved grid structure surrounds every semiconductor finger 29 on three sides and at the other end the finger intersects high resistivity region 23. The channel region extends from wall to wall of the trapezoidal finger and is at and above the narrow base; hence, a narrow channel is achieved after fabrication of the gate regions within the grooves.

One preferential etch solution to realize flat bottom trapezoidal grooves in gallium arsenide and other III-V semiconductor compounds is 1:$H_2SO_4$, 8:$H_2O_2$, 1:$H_2O$. The masked wafer was etched horizontally in a stirred or rotating solution at 0° C. (the ice point) for 4–5 minutes. The angle $\theta$ between the top surface and a nonparallel wall of the trapezoid was measured many times and is 61° to 63°. The vertical etch rate is about 2.5 microns/min. and the side etch rate at the semiconductor oxide interface is about 0.8 microns/min.

The metal gate regions are fabricated within the trapezoidal grid, FIG. 6, by evaporating metal in the groove at an angle using the overhang by insulating layer 17 to shadow the evaporation so that gate metal 30 is deposited in the corners of the grooves and on the lower part of the walls of semiconductor fingers 29. The metal surrounds the semiconductor finger on three sides for good blocking characteristics. In addition, for a high frequency device, it is desirable to reduce the junction capacitance of the gate, and preventing metal deposits on the bottom of groove 28 reduces this capacitance. Because of the shadowing effect gate metal is prevented from being evaporated onto the top part of the wall of trapezoidal finger 29; this improves the voltage withstanding capability of the gate and the top electrode.

Figure 7:
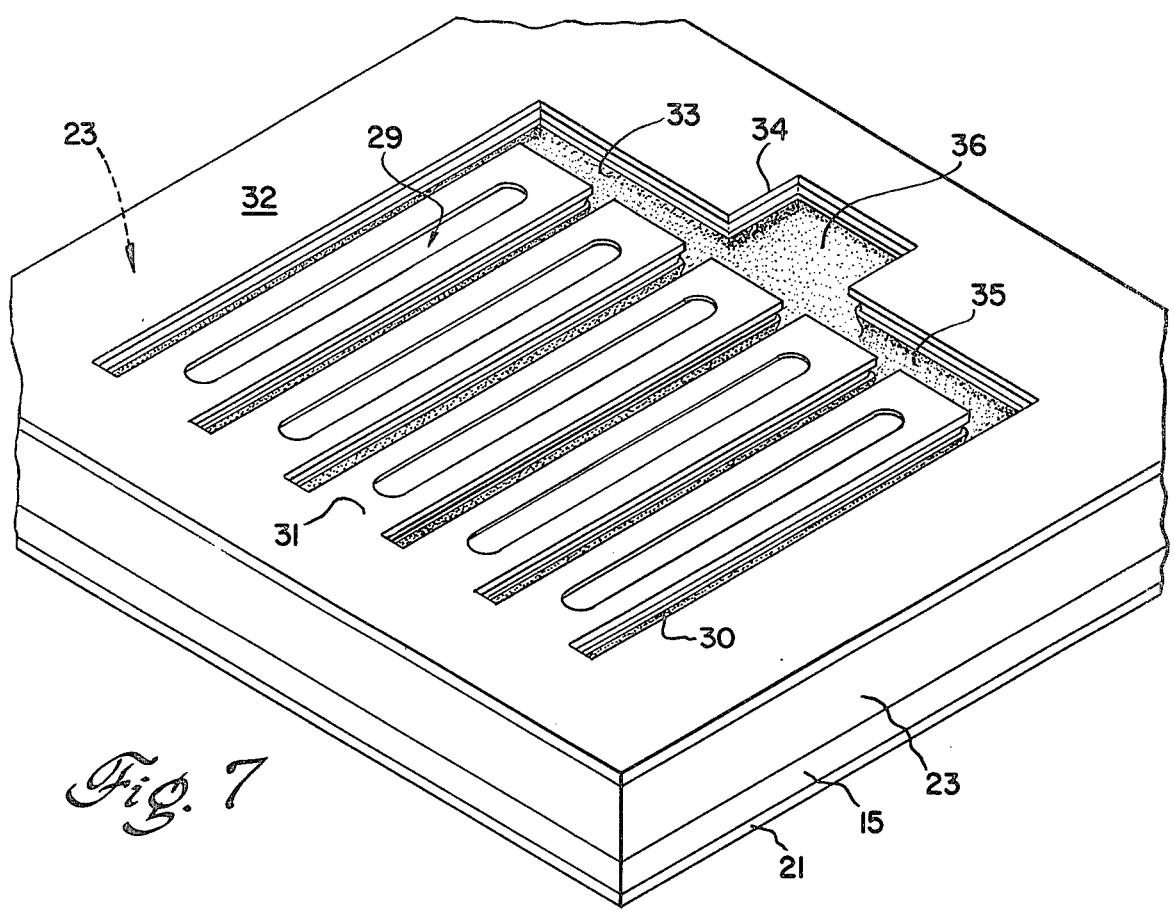
FIG. 7 is a perspective of the completed device.

At the same time, FIG. 7, source contact metallization 31 is deposited on the top of every semiconductor finger and on the entire top surface of high resistivity region 23 so as to form a large source contact pad 32. Gate metal additionally is deposited on the bottom of transversely extending groove 33 and on the bottom of gate contact pad well 34. This interconnection metallization 35 makes connection to all the individual Schottky gate regions and to gate contact pad 36.

It has been explained in copending application Ser. No. 061,450, now issued as U.S. Pat. No. 4,262,296, that the advantages of this high frequency device structure are that the vertical conducting channels between the gates are narrow leading to a high blocking gain, and that more contact area is available at the top of the device. Directionally deposited gate metal 30 is where it is needed, surrounding on three sides the lower part of trapezoidal semiconductor finger 29 so that it can effectively pinch off the vertical conducting channel at its smallest dimension at the narrow base of the trapezoid. The addition of high resistivity, semi-insulating isolation region 23 realizes an improved GaAs FET device structure with improved breakdown voltage, lower input gate capacitance, and lower source resistance. The high resistivity region all around the chip improves the breakdown voltage. The radiation converts the semiconductor under gate contact pad 36 to a high resistivity and this reduces the parasitic gate pad capacitance. It is possible for the gate metal to pinch off the entire area of the vertical conducting channel because every source semiconductor finger 29 runs into the high resistivity region 23. There is no extraneous current path from the source contacts to the drain at the bottom of the device. All the source semiconductor fingers 29 are connected to a single contact pad 32 to which an external electrical connection can be made. Consequently, this solves the problem of connecting the source semiconductor fingers together and provides a low source resistance.

Figure 9:
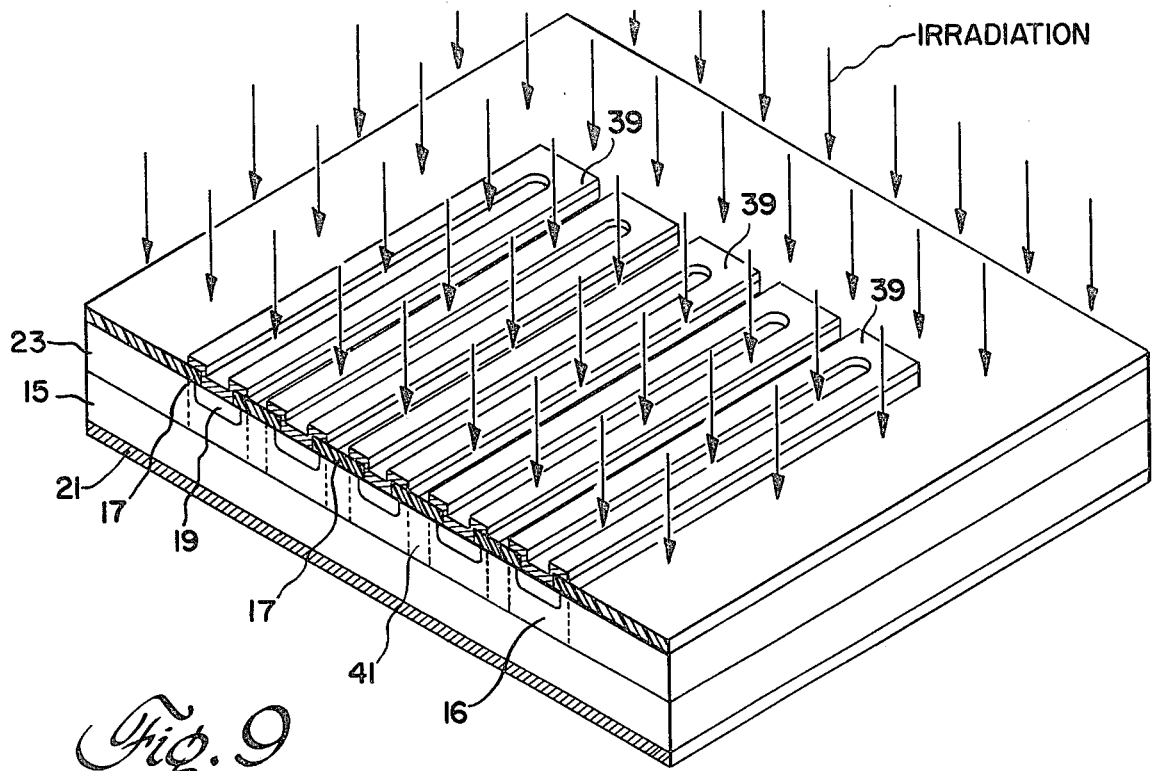
FIGS. 9 and 10 are cross sections of a modification which additionally has irradiated high resistivity regions at the middle of the gate grooves and is a high voltage, high frequency device.
Figure 10:
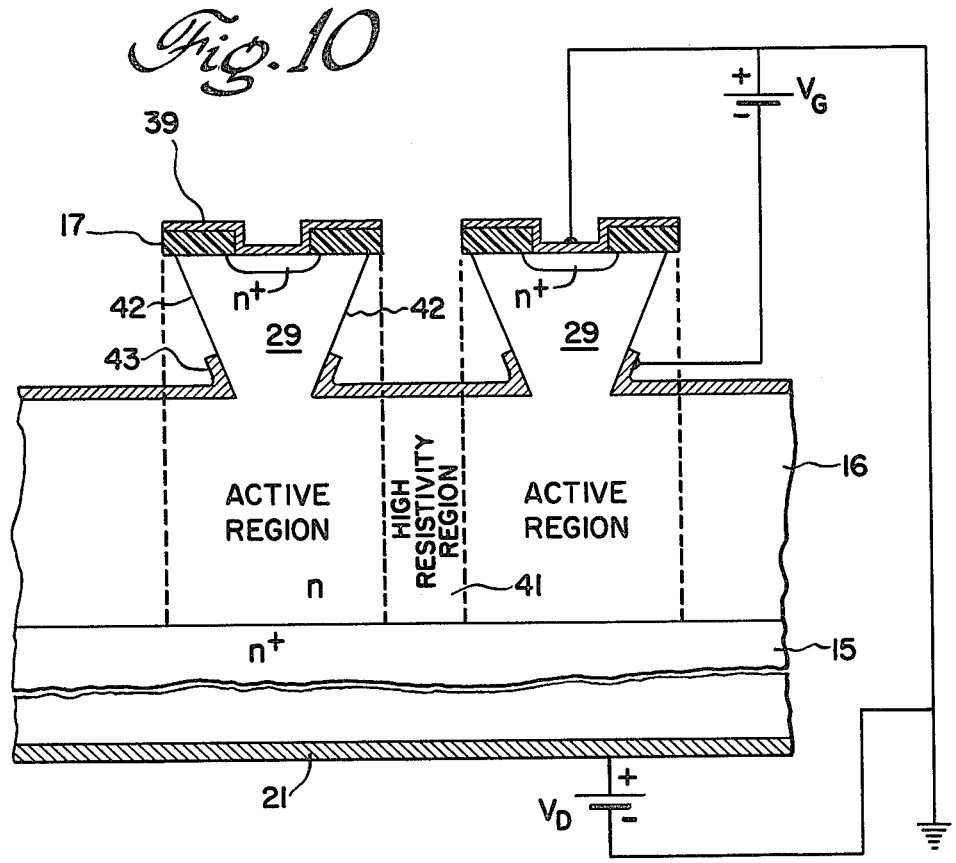

An additional improvement in device characteristics can also be achieved by irradiating the inactive area at the middle of the gate grooves. This is illustrated in FIGS. 9 and 10. The sequence of processing steps is briefly reviewed to clarify the differences. Insulating layer 17 (FIG. 1) is patterned and windows are opened for the diffusion of source areas 19. A layer of metal is deposited on the top surface which is patterned by photoresist masking and etching techniques to result in a row of metal stripes 39, FIG. 9, which cover the tops of the trapezoidal fingers and are deposited within the insulating layer windows and on top of the insulating layer on either side. These metal stripes 39 are the irradiation mask and protect the active areas of the device. After obtaining ohmic contacts, the chip can be irradiated with high energy particles to create high resistivity regions 41 which are aligned with the edges of metal stripes 39, and the edges of the chip are also converted to high resistivity, semi-insulating isolation regions. While it is preferred to convert the entire depth of epitaxial layer 16, partial conversion may be sufficient.

Figure 8:
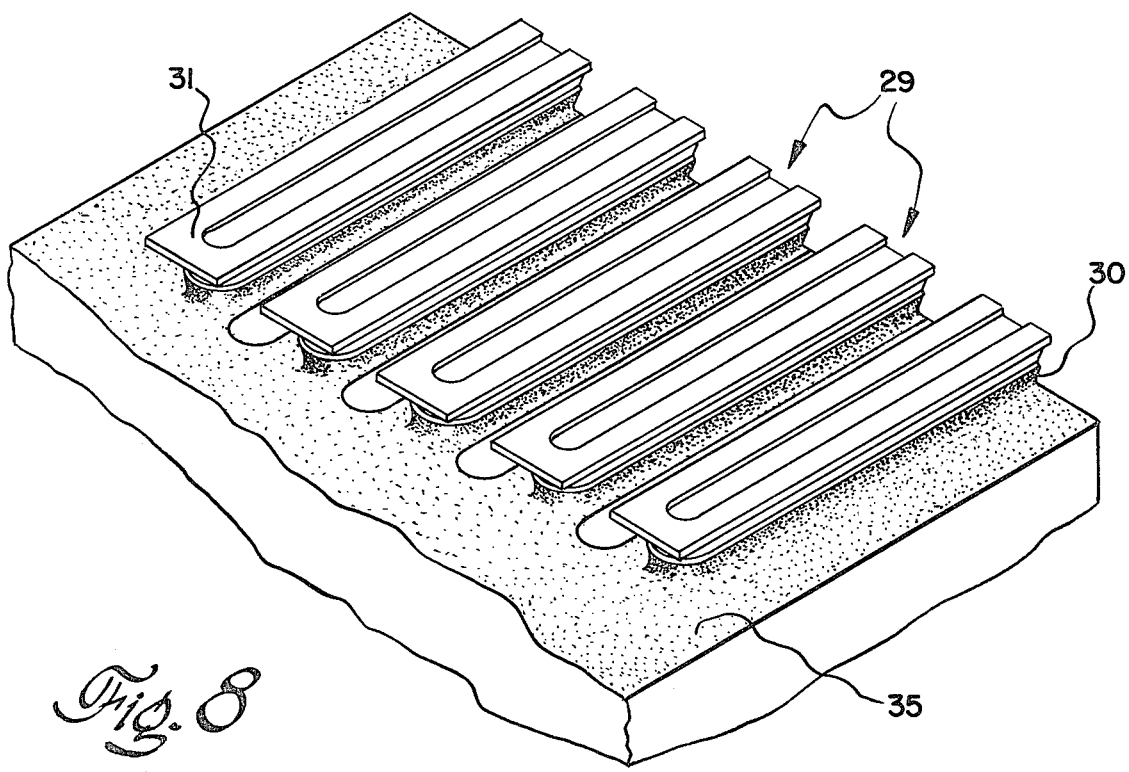
FIG. 8 is a perspective of the ends of the fingers in FIG. 7 showing the gate metal in greater detail.

The surface is masked with photoresist and patterned for grid and gate contact well etching the same as in FIG. 4. The unmasked insulating layer areas are removed and also the resist. Preferential etching is performed using the patterned insulating layer as a mask to fabricate the trapezoidal grooves 42, FIG. 10, the transversely extending groove at one end, and the gate contact pad area. Gate metal 43 is deposited within the grooves so as to cover a portion of the lower part of the walls of trapezoidal fingers 29 and so as to completely cover the bottom of the groove. The individual gate regions (see FIGS. 7 and 8) are interconnected by metal evaporated into the transversely extending groove, and the gate contact pad is fabricated at the same time. The top surface of the chip is also coated with metal, forming the source contact metallization which connects with source metal deposited on the tops of the semiconductor fingers. The advantage of this modification is that a gate region which covers the entire bottom of the groove has decreased gate input resistance which in turn improves the frequency response. High resistivity region 41 prevents the capacitance increase which would normally occur if the gate metal were placed over n-type GaAs.

FIG. 10 shows further details of the preferred embodiment of the invention, a high voltage extended drain, Schottky gate vertical channel field effect transistor. This is a high power high frequency device suitable for operation at 1 GHz or lower. Gate metal 43 is where it is needed, surrounding the semiconductor finger 29 on three sides so that it can effectively pinch off the vertical conducting channel at its smallest dimension at the narrow base of the trapezoid. Typical dimensions are that the trapezoidal grooves have a depth of 10 μm, and that the minimum channel width between gates is about 5-10 μm. The total thickness of epitaxial layer 16 is approximately 50 μm; the groove depth is seen to be substantially less than half of this total thickness so that the device has high voltage withstanding capability. Substrate layer 15 is typically 15 mils thick and is part of the drain region. In an exemplary device with the above dimensions the drain voltage, $V_D$, is approximately 600 volts and the gate voltage, $V_G$, is approximately 10 volts; this is an example of the high blocking gain (ratio of drain voltage is gate voltage) that is possible.

Figure 11:
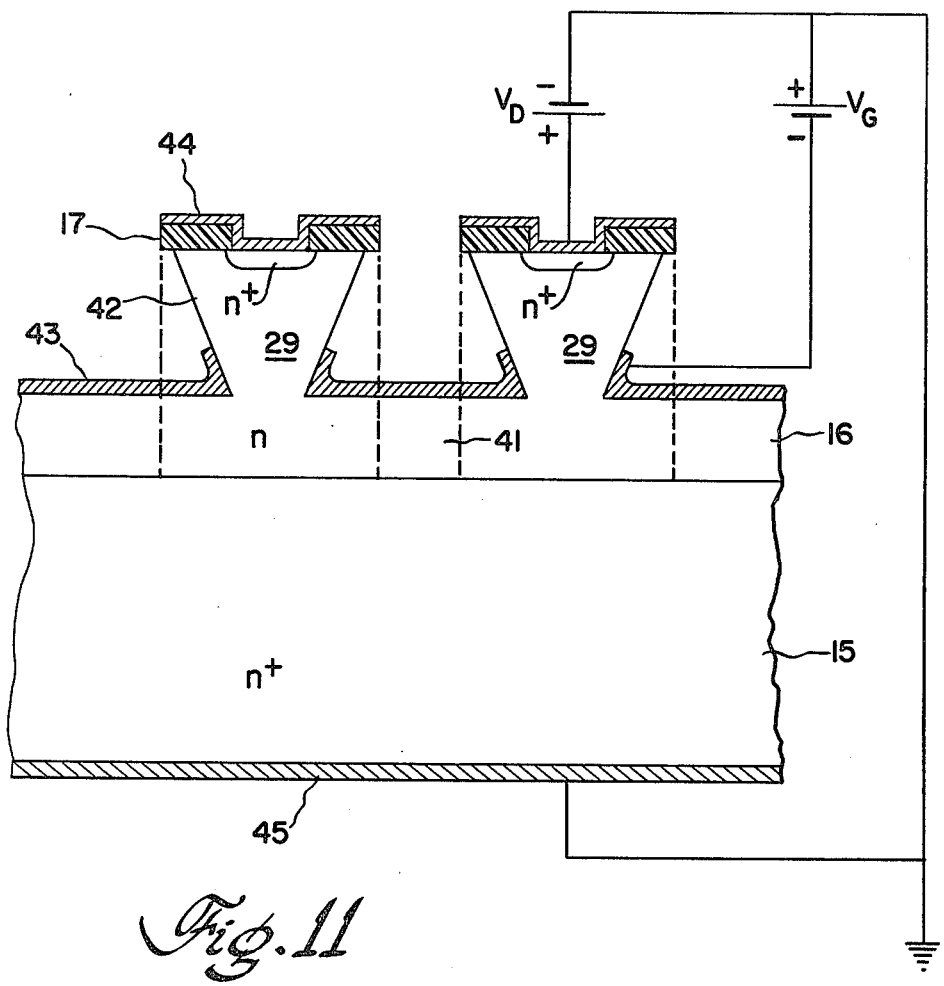
FIG. 11 is a modification of FIG. 9 for ultra high frequency operation.

The embodiment of FIG. 11 is an ultra high frequency device for operation above 1 GHz. This interdigitated vertical channel field effect transistor has the drain contact 44 at the top and the source metallization 45 at the bottom. The depth of grooves 42 is approximately 5 μm and the narrow base of trapezoidal finger 29 has a width of 1 μm or less. This corresponds to the minimum width of the vertical conducting channel. Epitaxial layer 16 is relatively thin such that the depth of the grooves is substantially greater than one-half the total thickness of the epitaxial layer.

To obtain a junction field effect transistor, the etched grooves are filled with opposite conductivity type epitaxial material as described in application Ser. No. 061,450, now issued as U.S. Pat. No. 4,262,296. The sequence of steps for making an improved JFET will be evident from the foregoing.

In conclusion, GaAs vertical channel field effect transistor structures with improved breakdown voltage, lower input gate capacitance and lower source (or drain) resistance are disclosed. These structures are fabricated by using high energy particle bombardment such as electron irradiation, neutron irradiation or proton bombardment to create high resistivity regions at appropriate regions of the devices.

While the invention has been particularly shown and described with reference to preferred embodiments thereof, it will be understood by those skilled in the art that various changes in form and details may be made therein without departing from the spirit and scope of the invention.

What is claimed is:

1. An improved vertical channel field effect transistor comprising:

first and second semiconductor layers of the same conductivity type gallium arsenide;

a high resistivity, semi-insulating isolation region extending at least partly through said first semiconductor layer;

the surface of said first layer having a row of parallel trapezoidal grooves connected together at one end by a transversely extending groove which surround on three sides a plurality of upstanding elongated semiconductor fingers that individually have an isosceles trapezoid cross section with a wide base at the top and an interior narrow base, the other end of every trapezoidal finger intersecting said high resistivity region, and a channel region at and adjacent to each narrow base which extends from wall to wall of the trapezoidal finger;

a gate region within said grooves surrounding each upstanding trapezoidal finger on three sides, and a gate contact pad making interconnection to all of said gate regions;

first metallizations on the surfaces of said trapezoidal fingers which are all interconnected with another contact pad on said high resistivity region, and a second metallization on the opposing surface of said second semiconductor layer, one of said first and second metallizations being the source contact and the other the drain contact.

2. The field effect transistor of claim 1 wherein both semiconductor layers have a (001) plane crystallographic orientation and wherein said parallel trapezoidal grooves are perpendicular to the [110] flat.

3. The field effect transistor of claim 2 wherein said high resistivity region is under said gate contact pad.

4. The field effect transistor of claim 2 wherein said gate regions are Schottky metal gates on only the corners of said trapezoidal grooves and lower part of the walls of said semiconductor fingers.

5. The field effect transistor of claim 2 which has additional high resistivity, semi-insulating isolation regions between said elongated semiconductor fingers extending from the bottom wall of each trapezoidal groove at least partly through said first semiconductor layer.

6. The field effect transistor of claim 5 wherein said gate regions are Schottky metal gates which cover the bottom walls of said trapezoidal grooves and the lower part of the walls of said semiconductor fingers.

7. An improved vertical channel field effect transistor comprising:

first and second (001) plane semiconductor layers of n-type gallium arsenide;

an irradiated high resistivity, semi-insulating region formed in said first semiconductor layer and completely surrounding the central active device area;

the surface of said first layer having a row of parallel trapezoidal grooves connected together at one end by a transversely extending groove which surround on three sides a plurality of upstanding elongated semiconductor fingers that individually have an isosceles trapezoid cross section with a wide base at the top and an interior narrow base, the other end of every trapezoidal finger intersecting said high resistivity region, and a channel region at and adjacent to each narrow base which extends from wall to wall of the trapezoidal finger;

an insulating layer on the top surface of each finger which projects laterally beyond its side edges;

gate metallizations within said grooves surrouding at least the lower part of each upstanding trapezoidal finger on three sides, and a gate contact pad on said high resistivity region interconnecting with said gate metallizations;

first metallizations on the surfaces of said trapezoidal fingers which are interconnected with another contact pad on said high resistivity region, and a second metallization on the opposing surface of said second semiconductor layer, one of said first and second metallizations being the source contact and the other the drain contact.

8. The field effect transistor of claim 7 wherein the parallel trapezoidal grooves and semiconductor fingers are perpendicular to the [110] crystal flat and wherein the angle between the top surface and a nonparallel wall of the trapezoidal finger is 61° to 63°.

9. The field effect transistor of claim 8 which has additional irradiated high resistivity, semi-insulating isolation regions between said elongated semiconductor fingers which are aligned with the edges of said insulating layers on the top surfaces of said fingers and extend from the bottom wall of each trapezoidal groove completely through said first semiconductor layer.

10. The field effect transistor of claim 9 wherein said gate metallizations also cover the entire bottom wall of every trapezoidal groove.

11. A method of making an improved vertical channel field effect transistor comprising the steps of:

providing a (001) crystalline plane n-type gallium arsenide substrate having an epitaxial layer;

applying an insulating layer to said epitaxial layer which has a pattern of openings including a row of windows oriented perpendicular to the [110] crystal flat;

depositing a patterned metal layer only within said insulating layer windows and realizing ohmic contacts;

masking the central active device area with a first mask that blocks or absorbs radiation;

bombarding the top surface with high energy particles to convert unmasked areas of said epitaxial layer to a high resistivity, semi-insulating region, and removing said first mask;

applying a second mask which has windows corresponding to the intended gate grid and a gate contact pad area, and removing the unmasked insulating layer;

preferentially etching said epitaxial layer through said last-mentioned windows to yield a row of trapezoidal grooves which are undercut beneath the edges of said insulating layer and are connected at one end by a transversely extending groove and a gate contact pad well to thereby create a plurality of elongated isosceles trapezoid semiconductor fingers which each have a wide base at the top and an interior narrow base and which each intersect said high resistivity region at one end, and removing said second mask; and depositing metallization on the top surface and within said etched grooves to form gate metal regions which surround every trapezoidal finger on three sides and connect to a gate contact pad and are capable when properly biased of pinching off a conducting channel at and adjacent to the narrow base which extends from wall to wall of every finger, and to form a contact metallization which covers the tops of said semiconductor fingers and inactive device areas.

12. A method of making an improved vertical channel field effect transistor comprising the steps of:

providing a (001) crystalline plane n-type gallium arsenide substrate having an epitaxial layer;

applying an insulating layer to said epitaxial layer which has a pattern of openings including a row of windows oriented perpendicular to the [110] crystal flat;

depositing metal stripes within said insulating layer windows and on said insulating layer at either side, and realizing ohmic contacts;

bombarding the top surface with high energy particles to convert said epitaxial layer between and around said metal stripes to high resistivity, semi-insulating regions;

opening windows in said insulating layer corresponding to the intended gate grid and a gate contact pad area;

preferentially etching said converted epitaxial layer through said insulating layer windows to yield a row of trapezoidal grooves which are undercut beneath the edges of said insulating layer and are connected at one end by a transversely extending groove and a gate contact pad well to thereby create a plurality of elongated isosceles trapezoid semiconductor fingers which each have a wide base at the top and an interior narrow base and which each intersect said high resistivity region at one end; and depositing metallization within said etched grooves and on the top surface to form gate metal regions which surround every trapezoidal finger on three sides and cover the bottom walls of said grooves between said fingers and which connect to a gate contact pad and are capable when properly biased of pinching off a conducting channel at and adjacent to the narrow base which extends from wall to wall of every finger, and to form a contact metallization which covers the tops of said semiconductor fingers and inactive device areas.

* * * * *